United States Patent [19]

Streit et al.

[11] Patent Number: 5,162,243
[45] Date of Patent: Nov. 10, 1992

[54] METHOD OF PRODUCING HIGH RELIABILITY HETEROJUNCTION BIPOLAR TRANSISTORS

[75] Inventors: Dwight C. Streit, Long Beach; Aaron K. Oki, Torrance, both of Calif.

[73] Assignee: TRW Inc., Redondo Beach, Calif.

[21] Appl. No.: 752,401

[22] Filed: Aug. 30, 1991

[51] Int. Cl.[5] .................... H01L 21/265; H01L 29/70
[52] U.S. Cl. ..................................... 437/31; 437/112; 257/198
[58] Field of Search ................ 437/31; 148/DIG. 72; 357/16

[56] References Cited

PUBLICATIONS

"The Technology And Physics of Molecular Beam Epitaxy", E. H. C. Parker, 1985, pp. 53–55.

Primary Examiner—Olik Chaudhuri
Assistant Examiner—Long Pham
Attorney, Agent, or Firm—G. Gregory Schivley; Ronald L. Taylor

[57] ABSTRACT

A technique for producing high reliability GaAsAlGaAs heterojunction bipolar transistors by Molecular Beam Epitaxy with beryllium base doping. Beryllium incorporation and diffusion, during base-layer deposition, is controlled through a combination of reduced substrate temperature and increase As/Ga flux ratio during MBE growth resulting in extremely stable heterojunction bipolar transistor profiles. In addition, graded InGaAs surface layers with non-alloyed refractory metal contacts are shown to significantly improve ohmic reliability to alloyed AuGe contacts. High gain (DC beta) is achieved by the use of an increased substrate temperature during emitter deposition. The HBTs in accordance with the present invention are useful in a number of important microwave applications such as log amps, a/d converters, and sample and hold circuits where high reliability is desired.

15 Claims, 3 Drawing Sheets

| | | $Al_xGa_{1-x}As$ | DOPING |
|---|---|---|---|
| 28 — 750Å $n^+$ CONTACT | | 0 | $7 \times 10^{18}$ cm$^{-3}$ |
| 20 — 1800Å n EMITTER | 26 — 300Å / 24 — 1200Å / 22 — 300Å | 0.3–0 / 0.3 / 0–0.3 | $5 \times 10^{17}$ cm$^{-3}$ |
| 18 — 1400Å $p^+$ BASE | | 0 | $1 \times 10^{19}$ cm$^{-3}$ |
| 16 — 7000Å $n^-$ COLLECTOR | | 0 | $7 \times 10^{15}$ cm$^{-3}$ |
| 14 — 6000Å $n^+$ SUB COLLECTOR | | 0 | $5 \times 10^{18}$ cm$^{-3}$ |
| 12 — GaAs SUBSTRATE | | | |

METHOD OF PRODUCING HIGH RELIABILITY HETEROJUNCTION BIPOLAR TRANSISTORS

BACKGROUND OF THE INVENTION

1. Technical Field

This invention relates to heterojunction bipolar transistors, and more particularly to techniques for producing high reliability GaAs/AlGaAs heterojunction bipolar transistors.

2. Discussion

Gallium arsenide/aluminum gallium arsenide heterojunction bipolar transistors (HBTs) are utilized in many important microwave applications such as log amps, analog to digital converters, and sample and hold circuits. Most commonly, such HBTs are produced by Molecular Beam Epitaxy (MBE) using beryllium as the p-type dopant. However, due to the intrinsic difficulties associated with beryllium incorporation and diffusion during MBE growth, HBTs produced by MBE with beryllium doping have generally had poor reliability.

Part of the problem is that it is difficult to grow HBT profiles that are well-defined. Moreover, even when they are well-defined as grown, after processing the beryllium p-type dopant moves from the base to the AlGaAs emitter when under bias at high temperature. This limits the usefulness of these devices for applications that require relatively high reliability components. In particular, the base-emitter p-n junction must be well-defined and coincident with the base-emitter heterojunction to avoid increased $V_{be}$, and reduced beta or gain.

The primary cause of rapid beta (B) degradation in conventional HBT structures is interstitial $Be^+$ diffusion from the base to the emitter, similar to interstitial $Zn^+$ diffusion in tunnel diodes. When the beryllium in located on interstitial lattice positions, it becomes a positively charged donor, and diffuses easily. What is desired is for the beryllium to enter substitutional lattice sites taking the place of the gallium atom on a gallium lattice site, in which case the beryllium will become an acceptor, will have strong bonding to the GaAs lattice, and will not diffuse easily.

Increasing the As/Ga flux ratio has been shown to help maintain sharp beryllium profiles, both during growth and subsequent annealing by increasing the concentration of gallium arsenide vacancies in the crystal. However, acceptable reliability has still not been achieved.

Thus, it would be desirable to provide a heterojunction bipolar transistor which is reliable and which maintains a high B over time. Further, it would be desirable to provide a method for the incorporation of beryllium during MBE growth which results in well-defined HBT profiles with minimal diffusion of beryllium p-type dopant from the base to the emitter when under bias at high temperatures.

SUMMARY OF THE INVENTION

Pursuant to the present invention, a method is provided for producing heterojunction transistors in which an undoped substrate is provided and heated to a temperature of approximately 580° to 620° C. A silicon doped AlGaAs collector with a minimum As/Ga flux ratio is grown on a substrate. The substrate temperature is then reduced to between 500° to 580° C., and a GaAs base layer is grown with the As/Ga flux ratio raised by a factor of two or more. The substrate temperature is raised to at least 600° C. and a AlGaAs emitter is grown on the base. This technique produces a high reliability heterojunction bipolar transistor with a well-defined beryllium profile that maintains a high B over its lifetime.

BRIEF DESCRIPTION OF THE DRAWINGS

The various advantages of the present invention will become apparent to one skilled in the art by reading the following specification and by reference to the following drawings in which.

DESCRIPTION OF THE PREFERRED EMBODIMENTS

Referring now to FIG. a profile of a heterojunction bipolar transistor 10 in accordance with a preferred embodiment of the present invention is shown. The transistor 10 is an n-p-n type transistor using beryllium as the p-type dopant. However, it will be appreciated that the techniques of the present invention may be employed to similar advantage in other kinds of semiconductor devices such as p-n-p transistors as well as tunnel diodes.

The present invention employs a modified Molecular Beam Epitaxy (MBE) growth process that can produce GaAs/AlGaAs HBTs with beryllium doping that have demonstrated high reliability due to the modified growth procedure. In general, beryllium incorporation and diffusion is controlled through a combination of reduced substrate temperature and increased As/Ga flux ratio during MBE growth, resulting in extremely stable HBT profiles.

It will be appreciated that the ability to produce robust HBTs by MBE is critically important to this technology in numerous microwave applications such as log amps, a/d converters, and sample and hold circuits. In particular, HBTs are very attractive for analog and digital microwave applications due to a number of advantages over other devices. These include the wide band-gap emitter which allows low-base resistance using very high-base doping, while maintaining good common emitter current gain B. Of course, the base-emitter p-n-junction must be well-defined and coincident with the base-emitter heterojunction to avoid increased $V_{be}$ and reduced B.

Figure 1:
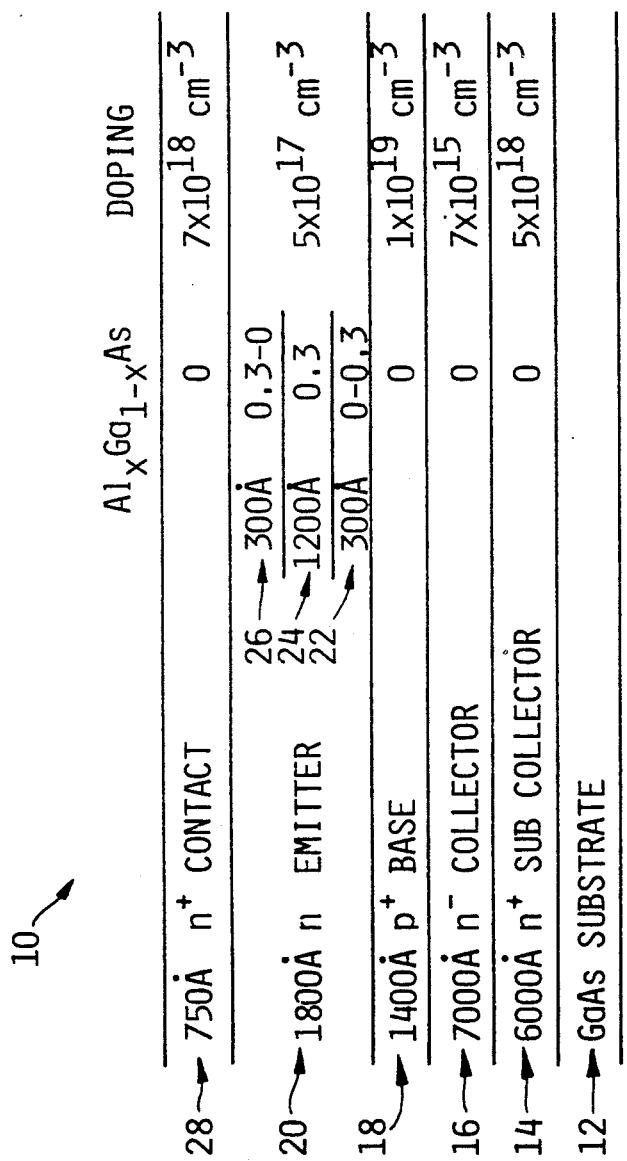
FIG. 1 is a cross-section of a profile of a heterojunction bipolar transistor produced in accordance with the preferred embodiment of the present invention.

In accordance with the preferred embodiment of the invention shown in FIG. 1, the HBT 10 is grown on a three inch undoped GaAs substrate 12 using a Varian Modular Gen II MBE System with silicon for n-type and beryllium for p-type doping. A 6,000 Angstrom n+ GaAs subcollector 14 is grown on the GaAs substrate 12. The purpose of the subcollector is to insure a good ohmic contact to the collector layer 16 which follows it.

Since the collector 16 is lightly doped, an ohmic contact which is etched down to the collector would not make an acceptable contact, so instead the contact is made with the heavily doped subcollector 14. In the preferred embodiment, the subcollector 14 is silicon doped with a concentration of $5 \times 10^{18}$ silicon atoms per centimeter cubed. The 7,000 angstrom n. AlGaAs collector 16 is doped with silicon at a concentration of $7 \times 10^{15}$ cm$^{-3}$, which is considerably less than the subcollector 14. Both the substrate 12 and subcollector 14 are grown at a conventional temperature of approximately 600° C.

The collector 16 is grown at a temperature of 600° C. throughout the entire collector with the minimum arsenic to gallium flux ratio required to maintain an arsenic stabilized surface; that is, at the minimum necessary for stoichiometric growth at this temperature. While the collector was grown at 600° C. in the preferred embodiment, an acceptable range would be between 580°–620° C.

A base layer 18 comprises a 1,400 angstrom p+ type GaAs base which is doped with beryllium as the p-type dopant at a concentration of $1 \times 10^{19}$ cm$^{-3}$. To achieve the advantages of the present invention it is important that the substrate temperature ($T_{sub}$) be reduced during the base 18 growth. In the preferred embodiment the substrate temperature is reduced to 570° C. However, an acceptable range may be between 500° to 580° C. Also critical to achieving the advantages of the present invention is to increase the arsenic to gallium flux ratio by a factor of two or more during the growth of the base 18. In the preferred embodiment the arsenic to gallium flux ratio is raised by a factor of three. The combination of reduced substrate temperature and increased arsenic gallium flux ratio has the effect of controlling the beryllium doping. The result is that the beryllium is present at the substitutional lattice sites rather than interstitial lattice positions.

It will be appreciated that in interstitial lattice positions the diffusivity would be greatly increased and the beryllium would become a positively charged donor rather than the desired negatively charged acceptor. Thus, the combination of reduced substrate temperature and increased arsenic flux drives the equilibrium growth conditions of the base towards the desired direction. The resulting fabricated devices are inherently stable to emitter/base junction movement because of the low concentration of Be$^3$ interstitials under this growth condition. It will be appreciated that in the MBE process the gallium flux will be constant throughout and the arsenic gallium flux ratio is increased by increasing the arsenic. Alternatively, it should be noted that a decrease in the growth rate would also have the effect of increasing the arsenic gallium flux ratio.

An 1,800 angstrom AlGaAs emitter 20 is grown on the base 18 with silicon doping of $5 \times 10^{17}$ cm$^{-3}$. Critical to the high reliability and high B of the present invention is that the arsenic pressure be reduced and the substrate temperature be increased during the MBE deposition of the AlGaAs emitter. In particular, the temperature may be increased to over 600° C. or more; in the preferred embodiment 620° C. is used. The arsenic gallium flux ratio is also reduced to a minimum level, such as that used for the growth of the collector. The reduced arsenic pressure and increased substrate temperature during the MBE deposition of the emitter 20 maintains high-quality material for the depleted AlGaAs emitter region, which minimizes base/emitter space charge recombination. This results in HBT devices with both high reliability and high B. One explanation is that because of the difficulty of electrons in traversing the region between the base and the emitter, by increasing the temperature as soon as the emitter is grown, you decrease the number of sites that provide an opportunity for electrons to recombine to facilitate their movement from the emitter to the base.

In accordance with the preferred embodiment, an emitter 20 incorporating three distinct regions is utilized. That is, a first graded region 22 begins with 0 percent aluminum and grades up to 30% aluminum in a linear fashion. The aluminum arsenide mole fraction is kept at 30% (70% gallium arsenide) throughout a second 1,200 angstrom region 24. The aluminum concentration then is decreased in a third region 26 throughout this 300 angstrom region in a linear fashion from 30% aluminum back to 0. It is desired to have the temperature increased during the emitter deposition because of the difference in the way that aluminum is incorporated as opposed to gallium. It should be noted that good quality gallium arsenide can be grown at low temperatures but that aluminum gallium arsenide requires higher temperatures. The purpose of the graded regions 22 and 26 in the emitter 20 is to prevent a notch in the conduction band which would hurt the device performance.

The substrate temperature is reduced again for the growth of a top GaAs contact layer 28. This layer comprises a 750 angstrom N+ silicon doped contact layer 28 with a doping concentration of $7 \times 10^{18}$ a silicon atoms per centimeter cubed. The contact layer 28 is used because of the high band-gap of the AlGaAs emitter which makes it difficult to make contact to. The GaAs contact 28 is doped heavily. To improve the reliability of the contact, indium is added in the preferred embodiment in the top few hundred angstroms alone. This makes the band-gap very small and makes it easy to make ohmic contacts with the emitter.

The contact layer 28 in the preferred embodiment is grown at a reduced temperature which may be anywhere between 500° to 600° C. Reducing the temperature helps to achieve high n+ doping levels.

The active layers of the transistor 10 were accessed by a combination of selective and non-selective wet etches. The self-aligned base ohmic metal was patterned with a double-photo resist lift-off technique that locates the base ohmic metal to within 0.15 μm of the emitter edge. AuBe-Pd-Au and AuGe-Ni-Ti-Au were used for the p-type and n-type ohmic contacts respectively. Alternatively, Ti-Pt-Au non-alloyed contacts to graded n-type InGaAs may be used. Isolation is provided by multiple boron implants. Chemical Vapor Deposition (CVD) silicon nitride was used for surface passivation.

The transistors 10 were life-tested under bias in 16-Pin DIPS with V=3V and $I_c$=2mA at oven temperatures of 240°, 260° and 280° C. This bias voltage and current density were chosen because they are typical for these devices in real applications. The 6 mW dissipated in each device increased the junction temperature 12° C. Sixteen devices from each wafer were tested at each of the three temperatures, and had a log normal distribution. Reference devices were baked without bias.

Measurements were performed at room temperature with common emitter current gain B measured at 1mA ($3.3 \times 10^3$A cm-2). Device failure was defined as a reduction in B to 90% of the original unstressed B.

Figure 2:
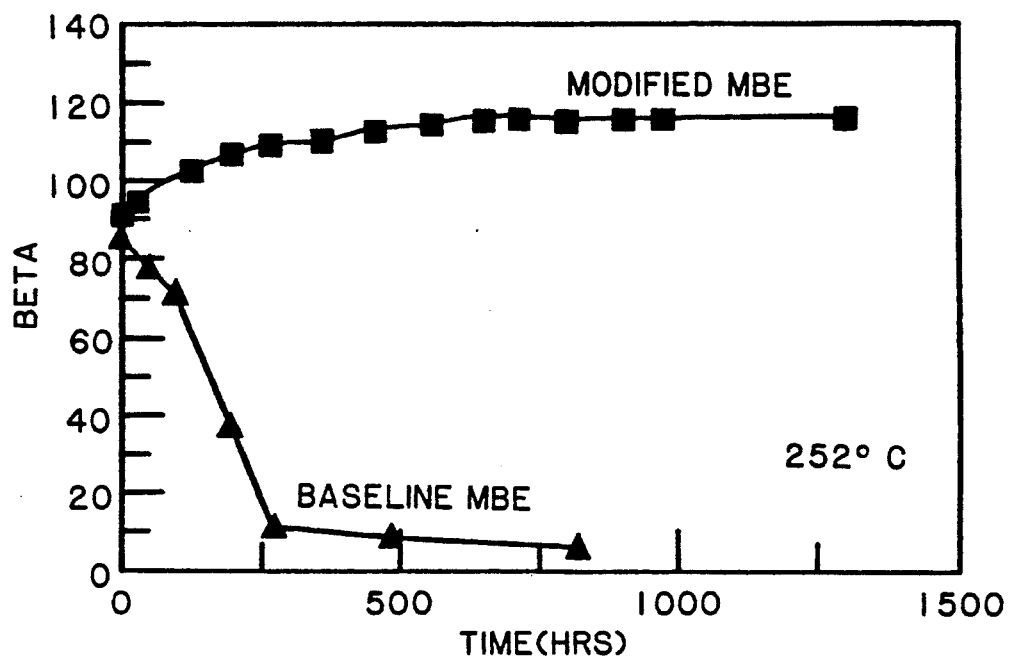
FIG. 2 is a graph comparing the gain of a heterojunction bipolar transistor produced in accordance with the present invention with to one produced using conventional processes.

Nearly all of the HBTs 10 grown using the modified growth procedure in accordance with the present invention described above showed an initial increase in B With thermal stress. This unusual B improvement is due to reduced recombination in the base-emitter space charged region, similar to that for annealed heterojunction diodes. Referring now to FIG. 2, the DC common emitter current gain B versus time at 252° C. junction temperature is shown for HBTs grown with base-line MBE conditions and with modified MBE conditions optimized for reliability in accordance with the present invention. B was measured on devices with $3 \times 10$ $\mu m^2$ emitters at room temperature with $I_c = 1mA$. The curve labeled "base line MBE" is for devices using grown base line conditions optimized only for high gain which clearly degrades faster than for the upper curve labeled "modified MBE", which is grown for conditions optimized for reliability. In particular, the conditions which optimized the devices for high gain were increased substrate temperature during AlGaAs emitter growth. The conditions of optimization for reliability of the devices in the upper curve consisted of reduced substrate temperature coincident with increased As/Ga flux ratio during base layer deposition.

Figure 3:
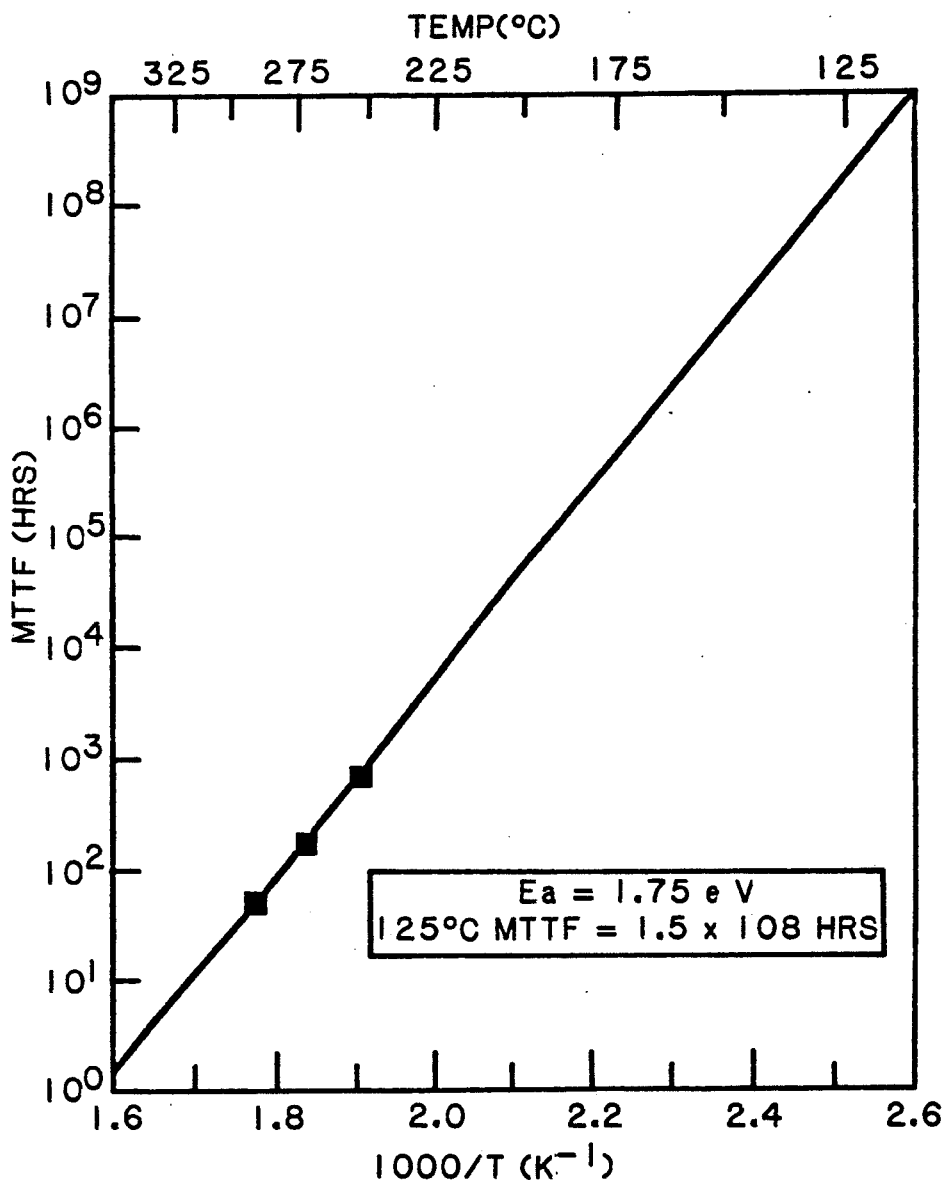
FIG. 3 is a graph of the mean time to failure of the HBT produced in accordance with the present invention as a function of operating temperature.

Referring now to FIG. 3, there is shown an Arrhenius plot of mean time to failure (MTTF) in hours versus 1/T for biased HBT devices grown by MBE using conditions optimized for reliability in accordance with the present invention. Emitter size is $3 \times 10$ $\mu m^2$, $V_{ce} = 3V$ and $I_c = 2mA$. Junction temperatures of 252°, 272°, and 292° C. are plotted. MTTF extrapolated to 125° C. is $1.5 \times 10^8$ hours ($1.7 \times 10^4$ years.) The activation energy for B failure $E = 1.75ev$ and the log standard deviation $\sigma = 0.38$.

Figure 4:
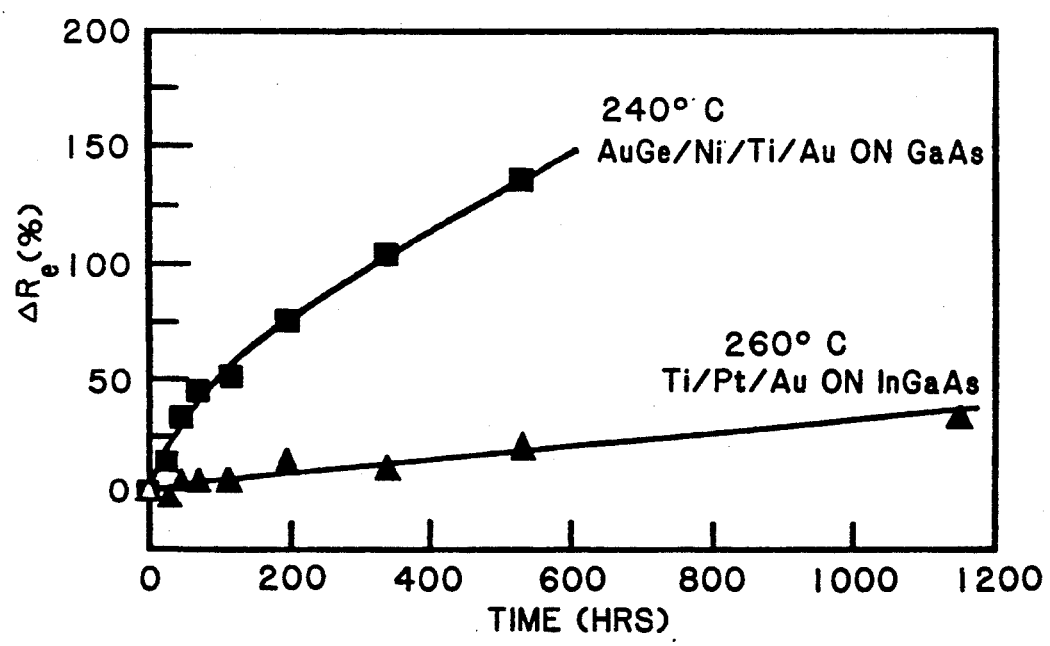
FIG. 4 is a graph of the percentage change in the emitter resistance $R_e$ from a preset value versus time for two types of ohmic contacts in accordance with the preferred embodiment of the present invention.

Emitter resistance degradation with thermal stress can also affect device performance, and depends on the ohmic contact scheme used. FIG. 4 shows a comparison of percentage change in emitter resistance $R_e$ from prestress value versus time at 240° C. for AuGe-Ni-Ti-Au alloyed to $n^{30}$ GaAs, and at 260° C. for refractory nonalloyed Ti-Pt-Au ohmic contacts on $In_{0.5} Ga_{0.5}$ as graded from GaAs over 750 angstroms. $R_e$ was measured at room temperature. AuGe-Ni-Ti-Au contacts employed to $n^+$ GaAs in our baseline HBTs degrade in a fashion similar to that of GaAs MOSFETs, due to the interdiffusion of Ga and Au. It has been found that non-alloyed Ti-Pt-Au contacts on $In_{0.5} Ga_{0.5} As$ graded to GaAs are extremely stable, as indicated by the lower curve. Not only do refractory contacts to InGaAs provide low emitter contact resistance, but they also solve the problem of ohmic contact degradation under thermal stress.

From the forgoing it can be seen that the present invention provides a method to control beryllium incorporation during the MBE growth of HBT structures, reducing Be diffusion from the base into the emitter during growth and during subsequent thermal stress under bias. This results in extremely reliable high-gain HBTs with MTTF equal to $1.5 \times 10^8$ hours at 125° C. Also, the use of contact layers graded to $In_{0.5} Ga_{0.5} As$ and metalized with Ti-Pt-Au make reliable ohmic contacts that degrade little with thermal stress. It will be appreciated that many other embodiments in addition to the preferred embodiments discussed above, may advantageously employ the techniques of the present invention. For example, these techniques can be employed on PNP type transistors. Also, besides HBTs the present invention could be easily applied to other types of semiconductor structures such as tunnel diodes or other structures where there is a high p-type doping next to a low n-type doping, or alternatively a high n-type doping next to a high p-type doping. In brief, in applications where a well-defined highly doped p-type layer is required the techniques of the present invention would be applicable.

Those skilled in the art can appreciate that other advantages can be obtained from the use of this invention and that modification may be made without departing from the true spirit of the invention after studying the specification, drawings, and following claims.

What is claimed is:

1. A method for producing n-p-n GaAs/AlGaAs heterojunction bipolar transistors, said method comprising the steps of:
   providing an undoped GaAs substrate;
   heating the substrate to a temperature approximately between 580° to 620° C.;
   growing a silicon doped AlGaAs collector with a minimum As/Ga flux ratio sufficient to maintain an arsenic stabilized surface;
   reducing the substrate temperature to a range between approximately 500° to 580° C.;
   growing a p-type GaAs base layer with the As/Ga flux ratio raised by a factor of two or more;
   raising the substrate temperature to approximately 600° C. or higher; and
   growing an AlGaAs emitter with the As/Ga flux ratio reduced to approximately the minimum level used for said collector growth.

2. The method of claim 1 wherein said p-type GaAs base uses beryllium for a dopant.

3. The method of claim 1 further comprising the step of, after growing said emitter, reducing the substrate temperature to between 500° to 600° C.; and growing a top GaAs contact layer.

4. The method of claim 1 further comprising the steps of growing an n-plus type GaAs subcollector on said substrate before growing said collector.

5. The method for claim 1 when said step of growing said emitter further comprises the steps of:
   growing a first graded emitter layer having an increasing aluminum concentration on said base;
   growing a second AlGaAs emitter layer; and
   growing a third graded emitter layer having a gradually reducing concentration of aluminum.

6. The method of claim 1 further comprising the step of growing an InGaAs emitter contact layer on top of said emitter layer.

7. The method of claim 6 wherein said contact layer is grown with a reduced substrate temperature and said contact layer comprises an n-type GaAs contact.

8. The method of claim 7 wherein said contact layer comprises InGaAs and wherein said method further comprises the step of depositing a Ti-Pt-Au ohmic contact on said contact layer.

9. A method for producing a heterojunction bipolar semiconductor device, said method comprising the steps of:
   providing a substrate material;
   heating the substrate to a temperature of approximately 580°–620° C.;
   growing a first layer with a minimum As/Ga flux ratio;
   reducing the substrate temperature to approximately 500° to 580° C.; and growing a GaAs second layer with the As/Ga flux ratio sufficient to maintain an arsenic stabilized surface raised by a factor of two or more.

10. The method of claim 9 wherein said semiconductor device is an n-p-n transistor.

11. The method of claim 10 wherein said first layer is a silicon doped AlGaAs collector.

12. The method of claim 11 wherein said second layer is a p-type GaAs base.

13. The method of claim 12 wherein said p-type GaAs base uses beryllium for a dopant.

14. The method of claim 12 further comprising the steps of raising the substrate temperature to 600° C. or higher, and growing an AlGaAs emitter with the As/Ga flux ratio reduced to approximately the minimum level used for said collector growth.

15. A method for producing n-p-n GaAs/AlGaAs heterojunction bipolar transistors, said method comprising the steps of:

providing an undoped GaAs substrate;

heating the substrate to a temperature approximately between 580° to 620° C.;

growing a silicon doped AlGaAs collector with a minimum As/Ga flux ratio sufficient to maintain an arsenic stabilized surface;

reducing the substrate temperature to a range between approximately 500° to 580° C.;

growing a p-type GaAs base layer with the As/Ga flux ratio raised by a factor of two or more;

raising the substrate temperature to approximately 600° C. or higher;

growing an AlGaAs emitter with the As/Ga flux ratio reduced to approximately the minimum level used for said collector growth; and reducing the substrate temperature to between 500° to 600° C.; and growing a top GaAs contact layer.

* * * * *